(12) United States Patent
Song

(10) Patent No.: US 11,839,089 B2
(45) Date of Patent: *Dec. 5, 2023

(54) ELECTRONIC DEVICE AND METHOD FOR FABRICATING THE SAME

(71) Applicant: SK hynix Inc., Icheon (KR)

(72) Inventor: Jeonghwan Song, Yongin (KR)

(73) Assignee: SK hynix Inc., Icheon (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/242,058

(22) Filed: Apr. 27, 2021

(65) Prior Publication Data

US 2021/0249472 A1     Aug. 12, 2021

Related U.S. Application Data

(63) Continuation of application No. 16/886,465, filed on May 28, 2020, now Pat. No. 11,037,984.

(30) Foreign Application Priority Data

Dec. 17, 2019   (KR) .......................... 10-2019-0168829

(51) Int. Cl.
   *G11C 11/00*      (2006.01)
   *H10B 63/00*      (2023.01)
   (Continued)

(52) U.S. Cl.
   CPC ........... *H10B 63/20* (2023.02); *H01L 23/528* (2013.01); *H10B 63/845* (2023.02);
   (Continued)

(58) Field of Classification Search
   None
   See application file for complete search history.

(56) References Cited

U.S. PATENT DOCUMENTS 7,417,271 B2 *  8/2008  Genrikh .............. H10N 70/826
                                                   257/E21.011
9,806,028 B2 * 10/2017  Lee ....................... H01L 45/147
(Continued)

FOREIGN PATENT DOCUMENTS

KR     20100023610 A     3/2010
KR     20170137562 A    12/2017

OTHER PUBLICATIONS

Chun-An Lin et al., "Impact of barrier layer on HfO2-based conductive bridge RAM", 2019, Applied Physics Letters, 114, 093105, vol. 114. Issues 9 (Year: 2019).*

(Continued)

*Primary Examiner* — Viet Q Nguyen

(57) ABSTRACT

A method for fabricating an electronic device including a semiconductor memory including one or more memory elements, includes: forming a first insulating layer; forming a diffusion barrier layer over the first insulating layer; forming a second insulating layer over the diffusion barrier layer, the second insulating layer and the first insulating layer being formed of a common insulating material; doping one of a first dopant and a second dopant in the first insulating layer to form a selection element layer when the first dopant is doped or to form a variable resistance layer when the second dopant is doped; and doping the other one of the first dopant and the second dopant in the second insulating layer.

20 Claims, 14 Drawing Sheets

(51) Int. Cl.
  H01L 23/528 (2006.01)
  H10N 70/00 (2023.01)
  H10N 70/20 (2023.01)
(52) U.S. Cl.
  CPC ........... H10N 70/011 (2023.02); H10N 70/24 (2023.02); H10N 70/826 (2023.02); H10N 70/841 (2023.02)

(56) References Cited

U.S. PATENT DOCUMENTS

| | | | |
|---|---|---|---|
| 9,960,350 B2 * | 5/2018 | Ha | H01L 45/00 |
| 10,236,061 B2 * | 3/2019 | Hou | H10N 70/8833 |
| 11,037,984 B1 * | 6/2021 | Song | H10B 63/20 |
| 2013/0234097 A1 * | 9/2013 | Fujii | H01L 45/145 257/4 |

OTHER PUBLICATIONS

Yu Li et al, "Resistive Switching performance improvement via modulating nanoscale conductive filament, involving the application of 2D layered materials", 2017, Nano-Micro small paper. https://onlinelibrary.wiley.com/doi/full/10.1002/smll.201604306 (Year: 2019).*

Bai et al., "Study of Multi-level Characteristics for 3D Vertical Resistive Switching Memory", Scientific Reports, Jul. 22, 2014, pp. 1-7, 4:5780; DOI:10.1038/srep05780 (2014), www.nature.com.

Callister, "Aluminum for Integrated Circuit Interconnects", Materials Science and Engineering, Sep. 28, 2015, 2 pages, http://thoughtcrackers.blogspot.com/2015/09/aluminum-for-integrated-circuit.html.

Gosele, "Fast Diffusion in Semiconductor", Annual Review of Material Science 18, 1988, 23 pages, HTML-Version 2/97, https://www.tf.uni-kiel.de/matwis/amat/def_ge/artikel/facsimil/fast_dif.html.

* cited by examiner

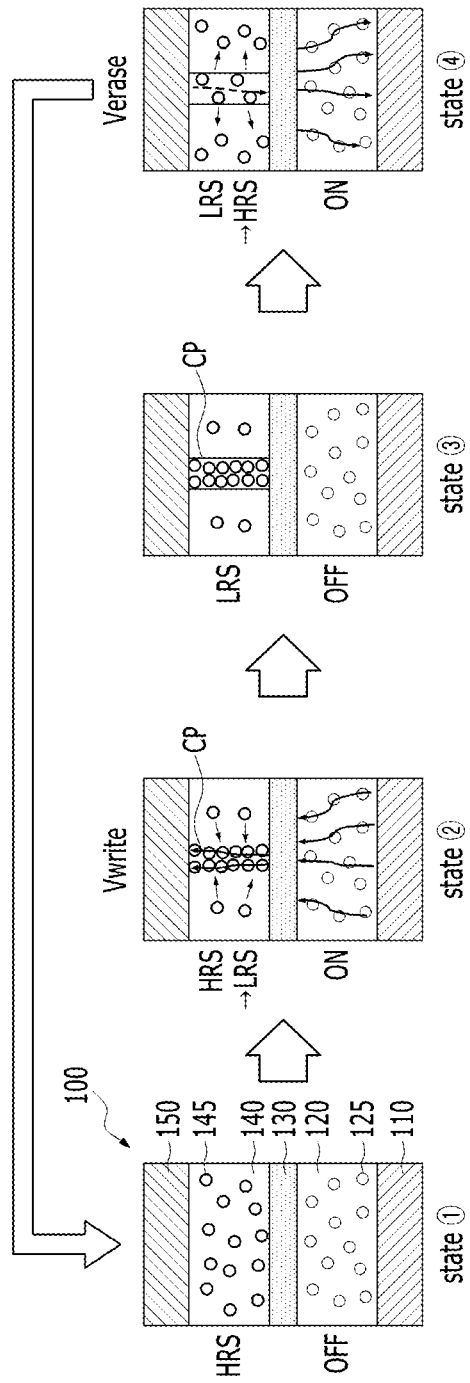

US 11,839,089 B2

ELECTRONIC DEVICE AND METHOD FOR FABRICATING THE SAME

CROSS-REFERENCE TO RELATED APPLICATION

The present application is a continuation of U.S. application Ser. No. 16/886,465 filed May 28, 2020, which claims priority to Korean Patent Application No. 10-2019-0168829, filed on Dec. 17, 2019, which are incorporated herein by reference in their entirety.

TECHNICAL FIELD

This patent document relates to memory circuits or devices and their applications in electronic devices or systems.

BACKGROUND

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices can store data using a characteristic that they are switched between different resistance states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes various embodiments of an electronic device capable of implementing high integration and reducing process difficulty while securing characteristics of memory cells, and a method for fabricating the same.

In an embodiment, an electronic device includes a semiconductor memory including one or more memory elements. Each of the memory elements includes: a selection element layer in which a first dopant is doped in an insulating material; and a variable resistance layer in which a second dopant is doped in the insulating material, wherein a diffusivity of the second dopant in the insulating material is greater than a diffusivity of the first dopant in the insulating material.

In another embodiment, a method for fabricating an electronic device comprising a semiconductor memory including one or more memory elements, includes: forming a first insulating layer; forming a diffusion barrier layer over the first insulating layer; forming a second insulating layer over the diffusion barrier layer, the second insulating layer and the first insulating layer being formed of a common insulating material; doping one of a first dopant and a second dopant in the first insulating layer to form a selection element layer when the first dopant is doped or to form a variable resistance layer when the second dopant is doped; and doping the other one of the first dopant and the second dopant in the second insulating layer.

In another embodiment, a method for fabricating an electronic device comprising a semiconductor memory including one or more memory elements, includes: forming an insulating layer; doping one of a first dopant and a second dopant in a lower portion of the insulating layer to form a selection element layer when the first dopant is doped or to form a variable resistance layer when the second dopant is doped; and doping the other one of the first dopant and the second dopant in an upper portion of the insulating layer.

These and other aspects, embodiments and associated advantages are described in greater detail in the drawings, the description and the claims.

BRIEF DESCRIPTION OF THE DRAWINGS

FIG. 2 is a cross-sectional view sequentially illustrating a method of operating the memory element of FIG. 1 according to an embodiment.

DETAILED DESCRIPTION

Figure 1:
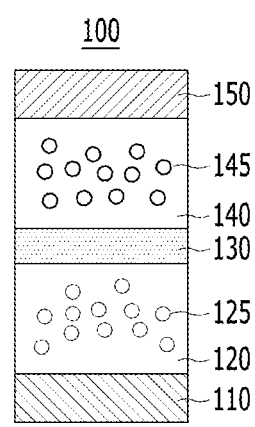
FIG. 1 is a cross-sectional view illustrating a memory element according to an embodiment of the present disclosure.

Various examples and embodiments of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or embodiments. In presenting a specific example in a drawing or description having two or more layers in a multi-layer structure, the relative positioning relationship of such layers or the sequence of arranging the layers as shown reflects a particular embodiment for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

FIG. 1 is a cross-sectional view illustrating a memory element 100 according to an embodiment of the present disclosure.

Referring to FIG. 1, the memory element 100 may include a stack structure of a first electrode layer 110, a selection element layer 120, a diffusion barrier layer 130, a variable resistance layer 140, and a second electrode layer 150.

The first electrode layer 110 and the second electrode layer 150 may be positioned at both ends of the memory element 100, for example, at a lower end and an upper end thereof, respectively, and may function to apply a voltage required for the operation of the memory element 100. The first electrode layer 110 and the second electrode layer 150 may be formed of various conductive materials, for example, a metal such as platinum (Pt), tungsten (W), aluminum (Al), copper (Cu), or tantalum (Ta), a metal nitride such as titanium nitride (TiN) or tantalum nitride (TaN), or a combination thereof. Alternatively, the first electrode layer 110 and the second electrode layer 150 may be a carbon electrode.

The selection element layer 120 may function to reduce and/or suppress leakage current between adjacent memory cells, in a memory device (e.g., a memory device 600 shown in FIG. 6) including the memory element 100 as a memory cell and having a cross point array structure. To this end, the selection element layer 120 may have a characteristic for blocking or hardly allowing a current to flow therethrough when a magnitude of an applied voltage is less than a predetermined threshold value and for allowing a current to abruptly increase above the threshold value. The threshold value may be referred to as a threshold voltage, and the selection element layer 120 may be in a first state (e.g., a turn-on state) or a second state (e.g., a turn-off state) based on the threshold voltage.

In the embodiment shown in FIG. 1, the selection element layer 120 may have a structure in which an insulating material is doped with a dopant. For convenience of description, the dopant in the selection element layer 120 is hereinafter referred to as a first dopant 125. Here, the insulating material for forming the selection element layer 120 may include a silicon-containing insulating material such as silicon oxide, silicon nitride, silicon oxynitride, or the like. Alternatively, the insulating material for forming the selection element layer 120 may include an insulating metal oxide, an insulating metal nitride, or a combination thereof. As the insulating metal oxide, for example, aluminum oxide may be used, and as the insulating metal nitride, for example, aluminum nitride may be used.

The first dopant 125 may serve to create trap sites which capture conductive carriers moving within the insulating material or provide a path through which the captured conductive carriers move while the first dopant 125 is substantially immobile in the insulating material. When a voltage equal to or greater than a threshold voltage is applied to the selection element layer 120, the conductive carriers move through the trap sites, thereby becoming an on state in which a current flows through the selection element layer 120. On the other hand, when a voltage applied to the selection element layer 120 is reduced below the threshold voltage, the conductive carriers does not move, and thus the selection element layer 120 becomes an off state in which substantially no current flows.

In order to generate the trap sites as described above, various elements capable of generating an energy level which can receive the conductive carriers in the insulating material may be used as the first dopant 125. For example, when the insulating material contains silicon, the first dopant 125 may include an element such as a metal having a valence different from that of silicon. Alternatively, when the insulating material contains a metal, the first dopant 125 may include an element such as a metal, silicon, or the like, having a valence different from that of this metal. In addition, in order to implement the above immobile property of the first dopant 125, elements having a relatively low diffusivity may be used as the first dopant 125. For example, when the insulating material contains silicon, the first dopant 125 may be an element having a diffusion coefficient (or diffusivity) less than a given value (e.g., $10^{-15}$ m$^2$/s) in silicon at 1100° C. As an example, the first dopant 125 may include gallium (Ga), boron (B), indium (In), phosphorus (P), arsenic (As), antimony (Sb), germanium (Ge), silicon (Si), carbon (C), tungsten (W), or a combination thereof.

The variable resistance layer 140 may be a portion that functions to store data in the memory element 100. To this end, the variable resistance layer 140 may have a variable resistance characteristic that switches between different resistance states depending on an applied voltage or current. When the variable resistance layer 140 is in a first resistance state (e.g., low resistance state), the memory element 100 may store first data, for example, data '1'. When the variable resistance layer 140 is in a second resistance state (e.g., high resistance state), the memory element 100 may store second data, for example, data '0'. The operation of changing the variable resistance layer 140 from the high resistance state to the low resistance state may be referred to as a set operation, and a voltage required for the set operation may be referred to as a set voltage (e.g., set voltage Vset in FIG. 3A). Also, the operation of changing the variable resistance layer 140 from the low resistance state to the high resistance state may be referred to as a reset operation, and a voltage required for the reset operation may be referred to as a reset voltage (e.g., reset voltage Vreset in FIG. 3A).

In the embodiment of FIG. 1, the variable resistance layer 140 may have a structure in which a dopant is doped in an insulating material, similarly to the selection element layer 120. Here, the insulating material of the variable resistance layer 140 may be substantially the same as the insulating material of the selection element layer 120, while the dopant of the variable resistance layer 140 may be different from the dopant of the selection element layer 120. For convenience of description, the dopant in the variable resistance layer 140 may be referred to as a second dopant 145.

The second dopant 145 may be mobile in the insulating material and thus serve to generate a conductive path in the variable resistance layer 140. This conductive path may be also referred to as a conductive bridge or filament. When a set voltage having a predetermined polarity is applied to the variable resistance layer 140, a conductive path through the variable resistance layer 140 may be generated to implement a low resistance state. The generated conductive path may be stably maintained even when the voltage applied to the variable resistance layer 140 is removed, and thus the low resistance state of the variable resistance layer 140 may be maintained. On the other hand, when a reset voltage having a polarity opposite to the set voltage is applied to the variable resistance layer 140, the generated conductive path may be cut and/or dissipated, and a high resistance state may be realized. Dissipation of the conductive path may also be maintained even when the voltage applied to the variable resistance layer 140 is removed. Depending on the relative magnitude between the set voltage/reset voltage of the variable resistance layer 140 and the threshold voltage of the selection element layer 120, the memory element 100 may exhibit different operating characteristics. This will be described later in more detail with reference to FIGS. 3A and 3B.

In order to generate or dissipate the conductive path by the movement of the second dopant 145 as described above, elements having a relatively high diffusivity may be used as the second dopant 145. The diffusivity of the second dopant 145 may be greater than that of the first dopant 125 in the same insulating material. For example, when the insulating material of the selection element layer 120 and the variable resistance layer 140 contains silicon, the second dopant 145 has a diffusion coefficient greater than a given value (e.g., $10^{-15}$ m$^2$/s) in silicon at 1100° C. As an example, the second dopant 145 may include copper (Cu), nickel (Ni), lithium (Li), iron (Fe), gold (Au), silver (Ag), or a combination thereof. In an embodiment, the second dopant 145 has a diffusion coefficient that is at least 100 times greater than that of the first dopant 125 in a specific material (e.g., silicon) at a given temperature (e.g., 1100° C.).

The diffusion barrier layer 130 may be used to substantially prevent intermixing between the first dopant 125 of the selection element layer 120 and the second dopant 145 of the variable resistance layer 140. During the operation of the memory element 100, the second dopant 145 of the variable resistance layer 140 may move toward the selection element layer 120. At this time, if the diffusion barrier layer 130 does not exist, some of the second dopants 145 may be moved to a portion of the selection element layer 120 adjacent to the variable resistance layer 140, so there may be a region where the first dopant 125 and the second dopant 145 are mixed at the interface between the selection element layer 120 and the variable resistance layer 140. This region may interfere with the operation of the memory element 100. Accordingly, the diffusion barrier layer 130 may be interposed between the selection element layer 120 and the variable resistance layer 140 to substantially prevent mixing of the first dopant 125 and the second dopant 145.

The diffusion barrier layer 130 may include a conductive material to physically separate the selection element layer 120 and the variable resistance layer 140 while maintaining electrical conduction therebetween. For example, the diffusion barrier layer 130 may include a metal such as titanium (Ti), tungsten (W), ruthenium (Ru), or aluminum (Al), a metal nitride such as titanium nitride (TiN) or tantalum nitride (TaN), or a combination thereof. The diffusion barrier layer 130 may have a thickness sufficient to prevent diffusion of the second dopant 145 from the variable resistance layer 140 to the selection element layer 120 during the operation of the memory element 100. Also, the diffusion barrier layer 130 may have a thickness sufficient to allow the first dopant 125 to penetrate the diffusion barrier layer 130 to be injected into the insulating material in a process of injecting the first dopant 125 to form the selection element layer 120 (see FIG. 4B to be described later). For example, the diffusion barrier layer 130 may have a thickness of several to several tens nm, more specifically, 1 to 20 nm.

The diffusion barrier layer 130 may be omitted. Since the first dopant 125 of the selection element layer 120 has an immobile characteristic, dopant diffusion between the variable resistance layer 140 and the selection element layer 120 may be small even if the diffusion barrier layer 130 is omitted. For example, the memory element 100 may not include the diffusion barrier layer 130, when dopant diffusion between the variable resistance layer 140 and the selection element layer 120 may be sufficiently small to perform the operation of the memory element 100.

The operation method of the memory element 100 will be described in more detail with reference to FIGS. 2, 3A, and 3B below.

FIG. 2 is a cross-sectional view sequentially illustrating a method of operating the memory element 100 of FIG. 1 according to an embodiment.

Referring to FIG. 2, in a first state (see state ①), the selection element layer 120 is in an off state in which the conductive carriers do not move in the selection element layer 120, and the variable resistance layer 140 maintain a high resistance state HRS in which the second dopants 145 are randomly distributed without forming one or more conductive paths in the variable resistance layer 140.

The second state (see state ②) indicates a state in which a write voltage Vwrite is applied to the memory element 100 of the first state through the first and second electrode layers 110 and 150. The write voltage Vwrite may be a voltage for changing the resistance state of the variable resistance layer 140 from the high resistance state HRS to the low resistance state LRS. In this case, the change of the resistance state of the variable resistance layer 140 may be based on the turn-on of the selection element layer 120. Specifically, the resistance state of the variable resistance layer 140 may be changed from the high resistance state HRS to the low resistance state LRS when the selection element layer 120 is turned on. Therefore, the write voltage Vwrite may have a magnitude greater than or equal to the threshold voltage of the selection element layer 120 and greater than or equal to the set voltage of the variable resistance layer 140. When the write voltage Vwrite is applied to the memory element 100, the conductive carriers of the selection element layer 120 may move through the trap sites, thereby changing the selection element layer 120 to an on state. In addition, the second dopants 145 of the variable resistance layer 140 may move to form a conductive path CP between the diffusion barrier layer 130 and the second electrode layer 150 in the variable resistance layer 140. As a result, the variable resistance layer 140 may be changed to the low resistance state LRS. As an example, when the second dopant 145 is a cation, for example, a metal cation, a negative voltage may be applied to the second electrode layer 150 and a positive voltage or a ground voltage may be applied to the first electrode layer 110. In this case, holes as the conductive carriers of the selection element layer 120 may move in a direction from the first electrode layer 110 toward the diffusion barrier layer 130 through the trap sites of the selection element layer 120, thereby allowing a current flow in the selection element layer 120. In addition, the second dopants 145 of the variable resistance layer 140 may move from the diffusion barrier layer 130 toward the second electrode layer 150 to form the conductive path CP.

A third state (see state ③) indicates after removing the applied write voltage Vwrite from the memory element 100 of the second state. In this case, since no current flows in the selection element layer 120, the selection element layer 120 may be in an off state. In addition, since the conductive path CP formed in the variable resistance layer 140 is maintained, the variable resistance layer 140 may maintain the low resistance state LRS.

A fourth state (see state ④) indicates a state in which an erase voltage Verase is applied to the memory element 100 of the third state through the first and second electrode layers 110 and 150. The erase voltage Verase may be a voltage for changing the resistance state of the variable resistance layer 140 from the low resistance state LRS to the high resistance state HRS. The erase voltage Verase may have a polarity opposite to that of the write voltage Vwrite, and the magnitude of the erase voltage Verase may be the same as or similar to that of the write voltage Vwrite. In this case, the change of the resistance state of the variable resistance layer 140 may be based on the turn-on of the selection element layer 120. Specifically, the resistance state of the variable resistance layer 140 may be changed from the low resistance state LRS to the high resistance state HRS when the selection element layer 120 is turned on. Therefore, the erase voltage Verase may have a magnitude greater than or equal to the threshold voltage of the selection element layer 120 and greater than or equal to the reset voltage of the variable resistance layer 140. Accordingly, the selection element layer 120 may be changed to an on state by the conductive carriers of the selection element layer 120 moving through the trap sites. In addition, the second dopants 145 of the variable resistance layer 140 may move in a direction opposite to the moving direction of the second dopant 145 when the write voltage Vwrite is applied, and thus the conductive path CP previously formed in the variable resistance layer 140 may disappear. Accordingly, the variable resistance layer 140 may be changed to the high resistance state HRS. As an example, when the second dopant 145 is a cation, for example, a metal cation, a positive voltage may be applied to the second electrode layer 150 and a negative voltage or a ground voltage may be applied to the first electrode layer 110. In this case, the holes as the conductive carriers of the selection element layer 120 may moves in a direction from the diffusion barrier layer 130 toward the first electrode layer 110 through the trap sites of the selection element layer 120, thereby allowing a current flow in the selection element layer 120. In addition, the second dopants 145 of the variable resistance layer 140 may move in a direction from the second electrode layer 150 toward the diffusion barrier layer 130, and thus the conductive path CP may be broken.

When the erase voltage Verase applied to the memory element 100 of the fourth state is removed, the memory element 100 may return to the first state. Accordingly, the selection element layer 120 may be changed to the off state, and the variable resistance layer 140 may maintain the immediately preceding resistance state, that is, the high resistance state HRS.

Figure 3A:
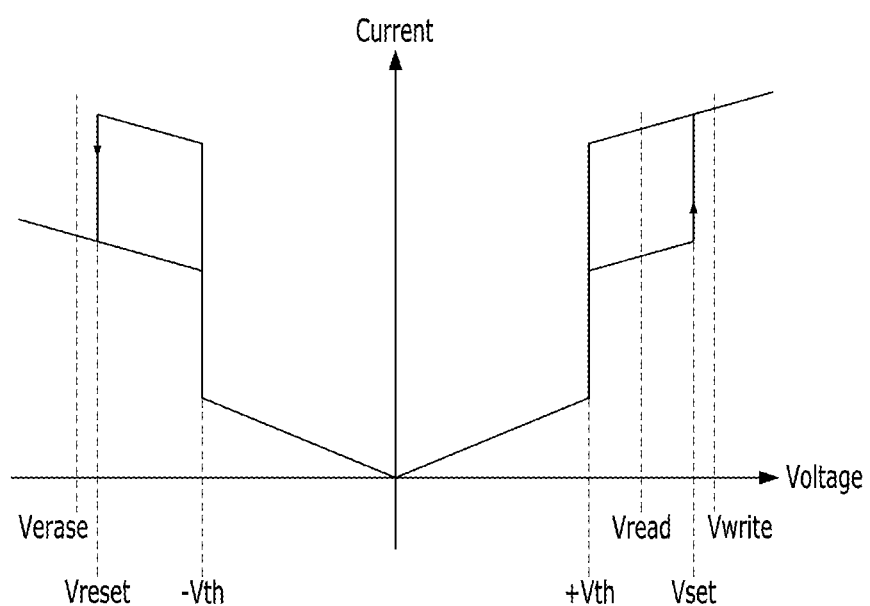
FIG. 3A is a current-voltage graph for explaining an example of a method of operating the memory element of FIG. 1.

FIG. 3A is a current-voltage graph for explaining an example of a method of operating the memory element 100 of FIG. 1. The graph of FIG. 3A relates to a case where the magnitude of the threshold voltage Vth of the selection element layer 120 is smaller than the magnitude of each of the set voltage Vset and the reset voltage Vreset of the variable resistance layer 140. Also, the graph of FIG. 3A relates to a case where the set voltage Vset is a positive voltage and the reset voltage Vreset is a negative voltage.

Referring to FIGS. 1 to 3A, when a voltage applied to the memory element 100 is changed from 0V to just before the threshold voltage ±Vth for turning on the selection element layer 120, very low current may flow through the selection element layer 120. This state may be referred to as an off state of the selection element layer 120. Since the selection element layer 120 is turned off and access to the variable resistance layer 140 is blocked, the variable resistance layer 140 maintain its resistance state, that is, the high resistance state HRS or the low resistance state LRS. As a result, when a voltage between 0V and the threshold voltage ±Vth is applied to the memory element 100, the memory element 100 may have the off state of the selection element layer 120 and the high resistance state HRS of the variable resistance layer 140, or may have the off state of the selection element layer 120 and the low resistance state LRS of the variable resistance layer 140.

When a magnitude of a voltage applied to the memory element 100 becomes greater than that of the threshold voltage ±Vth, the selection element layer 120 is turned on, so that a relatively large current may flow through the selection element layer 120. However, unless a voltage applied to the memory element 100 reaches the set voltage Vset or the reset voltage Vreset, the variable resistance layer 140 still maintains its resistance state, that is, the high resistance state HRS or the low resistance state LRS. As a result, when a voltage between the positive threshold voltage +Vth and the set voltage Vset or between the negative threshold voltage −Vth and the reset voltage Vreset is applied to the memory element 100, the memory element 100 may have the on state of the selection element layer 120 and the low resistance state LRS of the variable resistance layer 140, or may have the on state of the selection element layer 120 and the high resistance state HRS of the variable resistance layer 140. In this case, since the selection element layer 120 is in the on state, access to the variable resistance layer 140 may be possible, and thus the data stored in the variable resistance layer 140, that is, the resistance state of the variable resistance layer 140 may be read. In the embodiment of FIG. 3A, a read voltage Vread for reading the data stored in the variable resistance layer 140 has a value between the positive threshold voltage +Vth and the set voltage Vset. However, embodiments of the present disclosure are not limited thereto, and the read voltage Vread may have a value between the negative threshold voltage −Vth and the reset voltage Vreset. When the variable resistance layer 140 is in the low resistance state LRS, amount of current flowing through the memory element 100 may be relatively large, so it may be determined that the memory element 100 has a low resistance state. On the other hand, when the variable resistance layer 140 is in the high resistance state HRS, amount of current flowing through the memory element 100 may be relatively small, so it may be determined that the memory element 100 has a high resistance state.

When a voltage applied to the memory element 100 reaches the set voltage Vset, the resistance state of the variable resistance layer 140 may be changed from the high resistance state HRS to the low resistance state LRS in the ON state of the selection element layer 120. In addition, when a voltage applied to the memory element 100 reaches the reset voltage Vreset, the resistance state of the variable resistance layer 140 may be changed from the low resistance state LRS to the high resistance state HRS in the ON state of the selection element layer 120.

In the embodiment of FIG. 3A, since the magnitude of the set voltage Vset is larger than that of the positive threshold voltage +Vth, when a voltage applied to the memory element 100 reaches the set voltage Vset, the write operation of changing the resistance state of the variable resistance layer 140 from the high resistance state HRS to the low resistance state LRS may be performed. That is, the write voltage Vwrite may have the same polarity as the set voltage Vset and may have the magnitude equal to or larger than the set voltage Vset to secure a margin. In addition, in the embodiment of FIG. 3A, since the magnitude of the reset voltage Vreset is larger than that of the negative threshold voltage −Vth, when a voltage applied to the memory element 100 reaches the reset voltage Vreset, the erase operation of changing the resistance state of the variable resistance layer 140 from the low resistance state LRS to the high resistance state HRS may be performed. That is, the erase voltage Verase may have the same polarity as the reset voltage Vreset and may have the magnitude equal to or larger than the reset voltage Vreset to secure a margin.

Figure 3B:
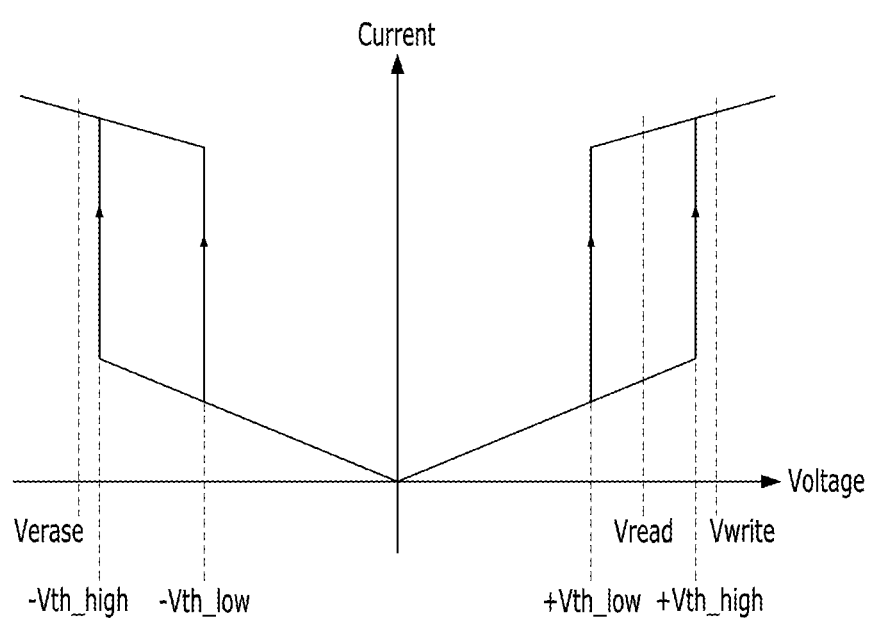
FIG. 3B is a current-voltage graph for explaining another example of a method of operating the memory element of FIG. 1.

FIG. 3B is a current-voltage graph for explaining another example of a method of operating the memory element 100 of FIG. 1. The graph of FIG. 3B relates to a case where the magnitude of the threshold voltage of the selection element layer 120 is larger than the magnitude of the set voltage/reset voltage of the variable resistance layer 140. Also, the graph of FIG. 3B relates to a case where the set voltage is a positive voltage and the reset voltage is a negative voltage.

First, a case of increasing a voltage in a positive direction, and a write operation accordingly will be described.

Referring to FIGS. 1, 2, and 3B, when a voltage applied to the memory element 100 gradually increases in the positive direction in a state of the high resistance state HRS of the variable resistance layer 140, the voltage applied to the selection element layer 120 may be greater than that applied to the variable resistance layer 140. For example, most of the voltage may be applied to the selection element layer 120. This is because the resistance of the off state of the selection element layer 120 is larger than the resistance of the high resistance state HRS of the variable resistance layer 140.

Then, when a voltage applied to the memory element 100 reaches a high threshold voltage +Vth_high, the selection element layer 120 may be turned on, and at the same time, the resistance state of the variable resistance layer 140 may be changed from the high resistance state HRS to the low resistance state LRS. That is, the write operation may be performed. The write voltage Vwrite may have the same polarity as the high threshold voltage +Vth_high and may have the magnitude equal to or larger than the high threshold voltage +Vth_high. The write operation may be performed at the high threshold voltage +Vth_high of the memory element 100 because the magnitude of the threshold voltage of the selection element layer 120 is greater than the set voltage of the variable resistance layer 140.

Meanwhile, once the write operation is performed, that is, when the variable resistance layer 140 has the low resistance state LRS, the threshold voltage of the memory element 100 may decrease. The threshold voltage of the memory element 100 in this state may be referred to as a low threshold voltage +Vth_low.

Therefore, when a voltage applied to the memory element 100 gradually increases in the positive direction in a state of the low resistance state LRS of the variable resistance layer 140 and reaches the low threshold voltage +Vth_low, the selection element layer 120 may be turned on. As a result, a current corresponding to the on state of the selection element layer 120 and the low resistance state LRS of the variable resistance layer 140 may flow through the memory element 100.

The read voltage Vread may have a value between the low threshold voltage +Vth_low and the high threshold voltage +Vth_high. When the read voltage Vread is applied, the memory element 100 may be in a high resistance state according to the high resistance state HRS of the variable resistance layer 140 and the off state of the selection element layer 120, or may be in a low resistance state according to the low resistance state LRS of the variable resistance layer 140 and the on state of the selection element layer 120.

Next, a case of increasing a voltage in a negative direction, and an erase operation accordingly will be described.

Referring back to FIGS. 1, 2, and 3B, when a voltage applied to the memory element 100 gradually increases in the negative direction in a state of the low resistance state LRS of the variable resistance layer 140, the magnitude of the voltage applied to the selection element layer 120 may be greater than that applied to the variable resistance layer 140. This is because the resistance of the off state of the selection element layer 120 is larger than the resistance of the low resistance state LRS of the variable resistance layer 140.

Then, when a voltage applied to the memory element 100 reaches a high threshold voltage −Vth_high, the selection element layer 120 may be turned on, and at the same time, the resistance state of the variable resistance layer 140 may be changed from the low resistance state LRS to the high resistance state HRS. That is, the erase operation may be performed. The erase voltage Verase may have the same polarity as the high threshold voltage −Vth_high and may have the magnitude equal to or larger than the high threshold voltage −Vth_high. The erase operation may be performed at the high threshold voltage −Vth_high of the memory element 100 because the magnitude of the threshold voltage of the selection element layer 120 is greater than the reset voltage of the variable resistance layer 140.

As described with reference to FIGS. 3A and 3B, relative difference between the threshold voltage of the selection element layer 120 and the set voltage/reset voltage of the variable resistance layer 140 may vary depending on the type of insulating material of the selection element layer 120 and the variable resistance layer 140, the type of dopant, the amount of the dopant, the thickness of the insulating material, or the like.

FIGS. 4A, 4B, 4C, and 4D are cross-sectional views illustrating a method for manufacturing the memory element 100 of FIG. 1. The same components as those in FIG. 1 are denoted by the same reference numerals, and redundant descriptions thereof will be omitted for the interest of brevity.

Figure 4A:
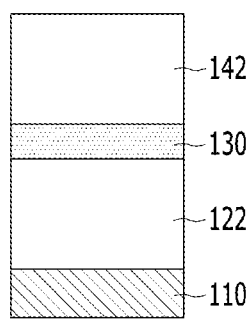
FIGS. 4A, 4B, 4C, and 4D are cross-sectional views illustrating a method for manufacturing the memory element of FIG. 1 according to an embodiment.

Referring to FIG. 4A, a stack structure of a first electrode layer 110, a first insulating layer 122, a diffusion barrier layer 130, and a second insulating layer 142 may be provided.

The first electrode layer 110 may be formed by depositing a conductive material for forming the first electrode layer 110 over a substrate (not shown) in which a predetermined lower structure is formed.

The first insulating layer 122 may be formed by depositing an insulating material for forming the first insulating layer 122 over the first electrode layer 110. The first insulating layer 122 may include a silicon-containing insulating material such as silicon oxide, silicon nitride, silicon oxynitride, or the like. Alternatively, the first insulating layer 122 may include an insulating metal oxide, an insulating metal nitride, or a combination thereof. As the insulating metal oxide, for example, aluminum oxide may be used, and as the insulating metal nitride, for example, aluminum nitride may be used.

The diffusion barrier layer 130 may be formed by depositing a conductive material for forming the diffusion barrier layer 130 over the first insulating layer 122.

The second insulating layer 142 may be formed by depositing an insulating material for forming the second insulating layer 142 over the diffusion barrier layer 130. In an embodiment, the second insulating layer 142 may be formed of the same insulating material as the first insulating layer 122. Accordingly, the forming process of the first insulating layer 122 and the forming process of the second insulating layer 142 may be substantially the same.

Figure 4B:
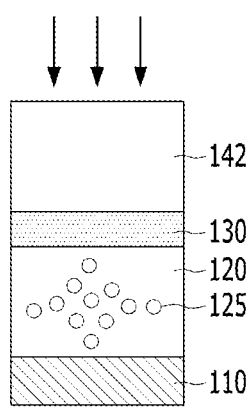

Referring to FIG. 4B, the selection element layer 120 may be formed by doping a first dopant 125 in the first insulating layer 122 (see an arrow).

The first dopant 125 may be doped by an ion implantation. In addition, the first dopant 125 may be an element that generates trap sites for capturing or moving conductive carriers in the first insulating layer 122.

The ion implantation process of the first dopant 125 may be performed such that an Rp (Projection Range) point is located inside the first insulating layer 122. Here, the Rp point may mean a distance an element projects in a thickness direction of a certain layer during an ion implantation process to the layer. For example, the Rp point (or projection range) may refer to a distance from a surface of the layer through which implanted dopants enter to a point at which the implanted dopants reach maximum concentration. In the thickness direction of the selection element layer 120, that is, in the stacking direction of the layers for forming the memory element, the concentration of the first dopants 125 may be as uniform as possible. When the thickness of the selection element layer 120 is relatively small, the concentration of the first dopants 125 may be relatively uniform in the thickness direction. However, when the selection element layer 120 has a relatively large thickness, the concentration of the first dopants 125 may not be uniform in the thickness direction. In this case, the concentration of the first dopants 125 may be uniformly adjusted by variously adjusting the number of ion implantation processes and the position of the Rp points. This will be described in more detail with reference to FIGS. 5A and 5B below.

Figure 5A:
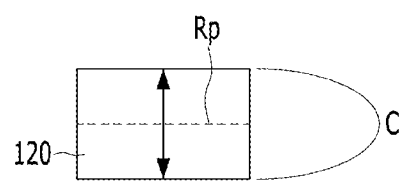
FIG. 5A is a view for explaining an example of a concentration distribution of first dopants in a selection element layer.
Figure 5B:
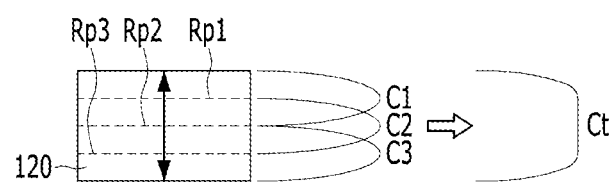
FIG. 5B is a view for explaining another example of a concentration distribution of first dopants in a selection element layer.

FIG. 5A is a view for explaining an example of the concentration distribution of first dopants (e.g., the first dopants 125 in FIG. 4B) in a selection element layer (e.g., the selection element layer 120 in FIG. 4B), and FIG. 5B is a view for explaining another example of the concentration distribution of the first dopants in the selection element layer. FIGS. 5A and 5B each show a case where the select element layer has a relatively large thickness.

Referring to FIG. 5A, the concentration distribution C of the first dopants after performing a single ion implantation process and subsequent heat treatment process is shown. Here, the concentration of the first dopants at the Rp point (see a dotted line) may be substantially highest while decreasing as the distance from the Rp point in the thickness direction of the selection element layer 120 increases (see an arrow). For example, the concentration distribution C of the first dopants may have a Gaussian distribution in which the Rp point is the concentration peak point of the first dopants. In the embodiment of FIG. 5A, the Rp point may be a point corresponding to about ½ of the thickness of the selection element layer 120 from the top surface of the selection element layer 120. In this case, the concentration of the first dopants may be relatively small at upper and lower interface portions of the selection element layer 120, and thus it may be difficult to generate desired trap sites. Therefore, insulation breakdown may occur at these interface portions.

Referring to FIG. 5B, unlike FIG. 5A, a plurality of ion implantation processes of the first dopants may be performed while varying the Rp points. As an example, when first to third Rp points Rp1 to Rp3 having different distances from the top surface of the selection element layer 120 are located, three ion implantation processes may be performed based on the first to third Rp points Rp1 to Rp3. In this case, the concentration of the first dopants may be substantially highest at each of the first to third Rp points Rp1 to Rp3, and the concentration of the first dopants may decrease as the distance from each of the first to third Rp points Rp1 to Rp3 in the thickness direction of the selection element layer 120 increases. That is, the first concentration distribution C1 of the first dopants may have a Gaussian distribution in which the first Rp point Rp1 is the concentration peak point, the second concentration distribution C2 of the first dopants may have a Gaussian distribution in which the second Rp point Rp2 is the concentration peak point, and the third concentration distribution C3 of the first dopants may have a Gaussian distribution in which the third Rp point RP3 is the concentration peak point. As a result, the overall concentration distribution Ct of the first dopants in the select element layer 120 may be substantially constant in the thickness direction. For example, a difference between the maximum concentration and the minimum concentration of the overall concentration distribution Ct of the first dopants in the select element layer 120 may be equal to or less than 10%, 5%, 3%, or 1% of the maximum concentration.

Referring back to FIG. 4B, the ion implantation process of the first dopant 125 may be performed by adjusting the number and the Rp points in consideration of the thickness of the selection element layer 120.

In this case, since the first dopant 125 passes through the second insulating layer 142, the diffusion barrier layer 130, and a portion of the first insulating layer 122, the ion implantation process may be performed with a relatively large ion implantation energy.

Figure 4C:
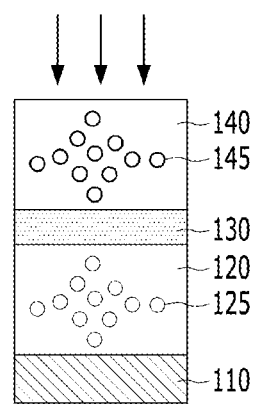

Referring to FIG. 4C, the variable resistance layer 140 may be formed by doping the second dopant 145 in the second insulating layer 142 (see an arrow).

The second dopant 145 may be doped by an ion implantation. In addition, the second dopant 145 may be an element having a characteristic suitable for generation and dissipation of a conductive path by moving in the second insulating layer 142.

The ion implantation process of the second dopant 145 may be performed such that the Rp point is located in the second insulating layer 142. In the thickness direction of the variable resistance layer 140, the concentration of the second dopants 145 may be as uniform as possible. To this end, the number of times of the ion implantation processes and the Rp points may be adjusted in consideration of the thickness of the variable resistance layer 140. For example, when the thickness of the variable resistance layer 140 is relatively small, the ion implantation described in FIG. 5A may be performed. Alternatively, when the thickness of the variable resistance layer 140 is relatively large, the ion implantation described in FIG. 5B may be performed.

The second dopant 145 may pass through only a portion of the second insulating layer 142, unlike the first dopant 125. Thus, the ion implantation energy of the second dopant 145 may be less than the ion implantation energy of the first dopant 125.

Figure 4D:
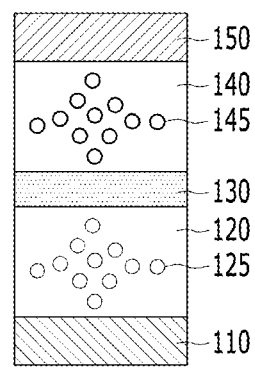

Referring to FIG. 4D, the second electrode layer 150 may be formed over the variable resistance layer 140. The second electrode layer 150 may be formed by depositing a conductive material for forming the second electrode layer 150 over the variable resistance layer 140.

Although not shown, in addition to the above manufacturing processes, a heat treatment process for activating the first and second dopants 125 and 145, or an etching process for selectively etching the stack structure of FIG. 4D to have a desired shape (e.g., a pillar shape), or both may be further performed.

According to the above-described memory element and its manufacturing method, the following beneficial aspects can be obtained.

First, by using the same insulating layer for forming the selection element layer and the variable resistance layer, but by changing only a type of a dopant, a memory element capable of substantially preventing leakage current in a cross point memory device with an easy and simple process may be provided. As a result, high integration of the memory device may be possible.

In addition, since the same process for the same insulating layer is performed repeatedly to form the selection element layer and the variable resistance layer, the process may be easy and simple. For example, referring back to FIG. 4A, because the first insulating layer 122 and the second insulating layer 142 may include the same material, or have substantially the same dimensions, or both, the process for forming the first insulating 122 may be similar to the process for forming the second insulating layer 142, thereby making the fabrication process of the memory element 100 including the selection element layer 120 and the variable resistance layer 140 relatively simple. In addition, since the same etching gas may be used to etch these insulating layers, the process also may be easy and simple.

Further, the process of doping the dopant into each of the insulating layers for forming the selection element layer and the variable resistance layer may be performed relatively late. That is, the doping process may be performed after forming the insulating layer for forming the variable resistance layer and before forming the second electrode layer. Therefore, it may be possible to suppress change in a doping profile of these dopants. As a result, characteristics such as reliability of the memory device may be improved. In contrast, if the dopant-doped selection element layer is first formed, and then a diffusion barrier layer, a variable resistance layer, or the like is formed thereon, the doping profile of the selection element layer may be significantly changed, thereby reducing the reliability of the memory device.

Figure 6:
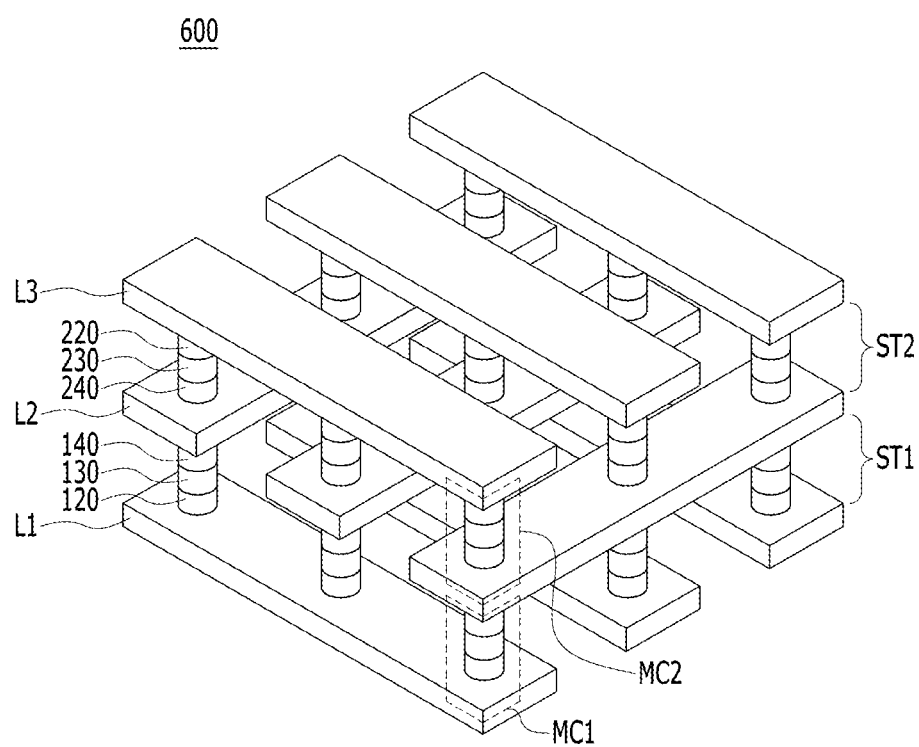
FIG. 6 is a perspective view illustrating a memory device according to an embodiment of the present disclosure.

FIG. 6 is a perspective view illustrating a memory device 600 according to an embodiment of the present disclosure. FIG. 6 may be a memory device including the memory element 100 of FIG. 1.

Referring to FIG. 6, the memory device 600 may include a first stack ST1 which includes a plurality of first conductive lines L1 extending in a first direction and parallel to each other, a plurality of second conductive lines L2 extending in a second direction crossing the first direction and parallel to each other, and a stack structure including a first selection element layer 120, a first diffusion barrier layer 130 and a first variable resistance layer 140, and interposed between the first conductive lines L1 and the second conductive lines L2 at each of intersections of the first conductive lines L1 and the second conductive lines L2. The first stack ST1 may be referred to as a cross point structure, and a unit memory cell may be disposed at each of the intersections of the first conductive lines 110 and the second conductive lines 140. The memory cell of the first stack ST1 may be referred to as a first memory cell MC1 hereinafter. The first selection element layer 120, the first diffusion barrier layer 130, and the first variable resistance layer 140 in FIG. 6 may be substantially the same as the selection element layer 120, the diffusion barrier layer 130, and the variable resistance layer 140 in FIG. 1, respectively. The first conductive line L1 and the second conductive line L2 may function as electrodes of the first memory cell MC1. However, embodiments of the present disclosure are not limited thereto. For example, the first electrode layer 110 and the second electrode layer 150 of FIG. 1 may be further interposed between the first conductive line L1 and the first selection element layer 120 and between the second conductive line L2 and the first variable resistance layer 140, respectively, and be included in the first memory cell MC1.

A second stack ST2 may be formed over the first stack ST1. The second stack ST2 may include the second conductive lines L2, a plurality of third conductive lines L3 extending in the first direction crossing the second conductive lines L2 and parallel to each other, and a stack structure including a second variable resistance layer 240, a second diffusion barrier layer 230, and a second selection element layer 220 and interposed between the second conductive lines L2 and the third conductive lines L3 at each of intersections of the second conductive lines L2 and the third conductive lines L3. Similar to the first stack ST1, the second stack ST2 may have a cross point structure in which a second memory cell MC2 is disposed at each of the intersections of the second conductive lines L2 and the third conductive lines L3. The second variable resistance layer 240, the second diffusion barrier layer 230, and the second selection element layer 220 may be substantially the same as the first variable resistance layer 140, the first diffusion barrier layer 130, and the first selection element layer 120, respectively.

Here, the second conductive line L2 may be shared by the first and second stacks ST1 and ST2. For example, when the first conductive line L1 functions as a word line in the first stack ST1, the third conductive line L3 may function as a word line in the second stack ST2, and the second conductive line L2 may function as a common bit line of the first and second stacks ST1 and ST2. Thus, the first memory cell MC1 and the second memory cell MC2 may be symmetrical with respect to the second conductive line L2 interposed therebetween. Accordingly, in the first memory cell MC1, the first selection element layer 120, the first diffusion barrier layer 130, and the first variable resistance layer 140 are sequentially stacked from bottom to top, but in the second memory cell MC2, the second variable resistance layer 240, the second diffusion barrier layer 230, and the second selection element layer 220 layer are sequentially stacked from bottom to top. The first memory cell MC1 and the second memory cell MC2 may be substantially the same except for a stacking order of layers and a difference in process due to the stacking order.

The process of forming the first memory cell MC1 may be substantially the same as that described in the above-described embodiment. That is, after forming a stack structure of a lower insulating layer (not shown), a diffusion barrier layer 130, and an upper insulating layer (not shown), a first dopant may be doped into the lower insulating layer to form the first insulating layer 120 and a second dopant may be doped into the upper insulating layer to form the first variable resistance layer 140.

On the other hand, the process of forming the second memory cell MC2 may include the same process of forming the stack structure of the lower insulating layer (not shown), the diffusion barrier layer 230, and the upper insulating layer (not shown). However, unlike the forming process of the first memory cell MC1, the second dopant may be doped into the lower insulating layer to form the second variable resistance layer 240 and the first dopant may be doped into the upper insulating layer to form the second selection element layer 220.

In the embodiment of FIG. 6, two stacks, that is, the first stack ST1 and the second stack ST2 are illustrated, but three or more stacks may be repeatedly stacked.

Meanwhile, it has been described that the diffusion barrier layer may be omitted in the above-described memory element of FIG. 1. A method for manufacturing a memory element in such a case will be described with reference to FIGS. 7A to 7C below. This method will be explained focused on differences from the above-described embodiment.

Figure 7A:
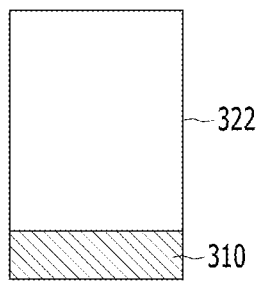
FIGS. 7A, 7B, and 7C are cross-sectional views illustrating a method for manufacturing a memory element according to an embodiment of the present disclosure.
Figure 7B:
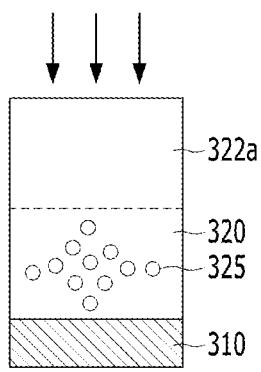
Figure 7C:
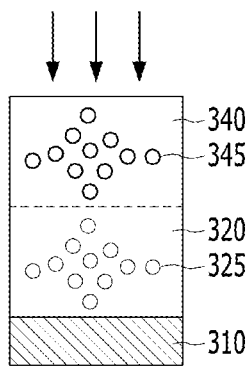

FIGS. 7A, 7B, and 7C are cross-sectional views illustrating a method for manufacturing a memory element according to an embodiment of the present disclosure.

Referring to FIG. 7A, a stack structure of a first electrode layer 310 and an insulating layer 322 may be provided.

The insulating layer 322 may include a silicon-containing insulating material such as silicon oxide, silicon nitride, silicon oxynitride, or the like. Alternatively, the insulating layer 322 may include an insulating metal oxide, an insulating metal nitride, or a combination thereof. As the insulating metal oxide, for example, aluminum oxide may be used, and as the insulating metal nitride, for example, aluminum nitride may be used.

Referring to FIG. 7B, a lower portion of the insulating layer 322 may be transformed into a selection element layer 320 by doping a first dopant 325 in the lower portion of the insulating layer 322. An upper portion 322a of the insulating layer 322 of FIG. 7B remains not to be transformed into the selection element layer 320. Here, the lower portion of the insulating layer 322 of FIG. 7B may refer to a region where a distance from a surface in contact with the first electrode layer 310 is smaller than the total thickness of the insulating layer 322 of FIG. 7A. As an example, a distance from a surface contacting the first electrode layer 310 to a top surface of the selection element layer 320 may correspond to about ½ of the total thickness of the insulating layer 322 of FIG. 7A.

The first dopant 325 may be doped by an ion implantation process, and the ion implantation process may be performed so that the Rp point is located in the lower portion of the insulating layer 322. As described above, the ion implantation process may be performed once or several times by changing the Rp points depending on the thickness of the selection element layer 320.

Referring to FIG. 7C, the upper portion 322a of the insulating layer 322 may be transformed into a variable resistance layer 340 by doping a second dopant 345 in the upper portion 322a of the insulating layer 322.

The second dopant 345 may be doped by an ion implantation process, and the ion implantation process may be performed such that the Rp point is located in the upper portion 322a of the insulating layer 322. As described above, the ion implantation process may be performed once or several times by changing the Rp points depending on the thickness of the variable resistance layer 340.

Subsequently, although not illustrated, a process of forming a second electrode layer on the variable resistance layer 340, or the like, may be further performed to form the memory element.

According to the embodiment shown in FIGS. 7A to 7C, the fabrication process of a memory element may be simpler. For example, the fabrication process of a memory element according to the embodiment shown in FIGS. 7A to 7C may be simpler than that according to the embodiment shown in FIGS. 4A to 4D.

Meanwhile, the memory element of FIG. 1, the diffusion barrier layer is formed by a deposition process separately from the selection element layer and the variable resistance layer. However, this diffusion barrier layer may be formed by further performing an ion implantation process in the processes of FIGS. 7A to 7C. A method for manufacturing a memory element in such a case will be described with reference to FIGS. 7D and 7E below. This method will be explained focused on differences from the above-described embodiment.

Figure 7D:
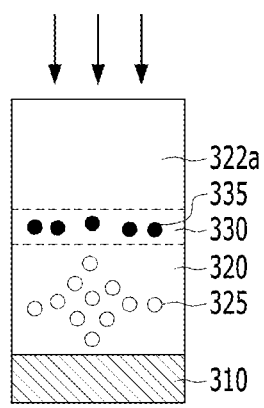
FIGS. 7D an 7E are cross-sectional views illustrating a method for manufacturing a memory element according to an embodiment of the present disclosure.
Figure 7E:
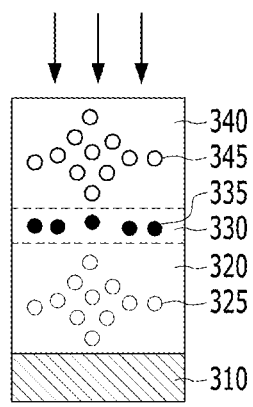

FIGS. 7D and 7E are cross-sectional views illustrating a method for manufacturing a memory element according to another embodiment of the present disclosure.

First, the above-described processes of FIGS. 7A and 7B may be performed.

Subsequently, referring to FIG. 7D, an intermediate portion of the insulating layer 322 of FIG. 7A may be transformed into a diffusion barrier layer 330 by doping a third dopant 335 in the intermediate portion of the insulating layer 322. An upper portion 322a of the insulating layer 322 remains not to be transformed into the selection element layer 320. Here, the intermediate portion of the insulating layer 322 may mean a portion between the selection element layer 320 and a variable resistance layer to be described later. The thickness of the diffusion barrier layer 330 may be smaller than the thickness of the selection element layer 320 and the thickness of the variable resistance layer to be described later.

The third dopant 335 may be doped by an ion implantation process, and may be different from the first dopant 325 and a second dopant to be described later. As the third dopant 335, boron (B), carbon (C), nitrogen (N), or a combination thereof may be used.

Referring to FIG. 7E, the upper portion 322a of the insulating layer 322 may be transformed into a variable resistance layer 340 by doping the upper portion 322a of the insulating layer 322 with a second dopant 345.

Subsequently, although not illustrated, a process of forming a second electrode layer on the variable resistance layer 340, or the like, may be further performed to form the memory element.

According to the embodiment of FIGS. 7D and 7E, the diffusion prevention layer 330 may be formed while the fabrication process of a memory element is relatively simple.

Figure 8:
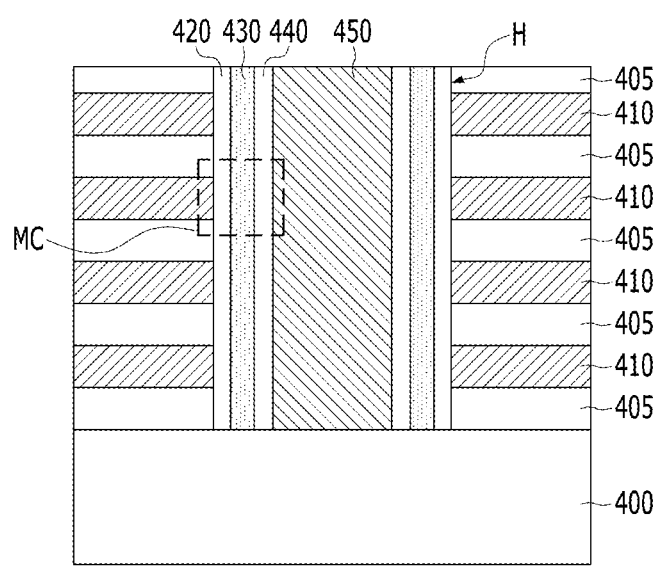
FIG. 8 is a cross-sectional view illustrating a memory device according to another embodiment of the present disclosure.

FIG. 8 is a cross-sectional view illustrating a memory device according to another embodiment of the present disclosure. FIG. 8 may be a memory device including the memory element 100 of FIG. 1.

Referring to FIG. 8, the memory device may include a substrate 400, a plurality of horizontal electrodes 410 and a plurality of interlayer insulating layers 405 which are alternately disposed over the substrate 400, a pillar-shaped vertical electrode 450 connected to the substrate 400 through the alternately stacked structure of the horizontal electrodes 410 and the interlayer insulating layers 405, and a stacked layer interposed between the horizontal electrodes 410 and the vertical electrode 450, and including a selection element layer 420, a diffusion barrier layer 430 and a variable resistance layer 440. A unit memory cell MC may be disposed between each of the horizontal electrodes 410 and the vertical electrode 450.

The selection element layer 420, the diffusion barrier layer 430, and the variable resistance layer 440 in FIG. 8 may be substantially the same as the selection element layer 120, the diffusion barrier layer 130, and the variable resistance layer 140 in FIG. 1, respectively. However, each of the selection element layer 420, the diffusion barrier layer 430, and the variable resistance layer 440 may extend in a direction perpendicular to a top surface of the substrate 400. For example, the vertical electrode 450 may extend in a specific direction perpendicular to a top surface of the substrate 400, and each of the selection element layer 420, the diffusion barrier layer 430, and the variable resistance layer 440 may extend in the specific direction.

In addition, in the embodiment of FIG. 8, the selection element layer 420, the diffusion barrier layer 430, and the variable resistance layer 440 are arranged in a direction from the horizontal electrode 410 to the vertical electrode 450. However, alternatively, the selection element layer 420, the diffusion barrier layer 430, and the variable resistance layer 440 may be arranged in a direction from the vertical electrode 450 to the horizontal electrode 410. That is, the arrangement order may be reversed to that shown in FIG. 8.

A method for manufacturing such a memory device will be briefly described as follows.

First, the plurality of interlayer insulating layers 405 and the plurality of horizontal electrodes 410 may be alternately deposited over the substrate 400. Subsequently, the alternatively stacked structure of the interlayer insulating layers 405 and the horizontal electrodes 410 may be selectively etched to form a hole H passing through the alternatively stacked structure. Subsequently, the selection element layer 420, the diffusion barrier layer 430, and the variable resistance layer 440 may be formed on sidewalls of the hole H. The process of forming the selection element layer 420, the diffusion barrier layer 430, and the variable resistance layer 440 may be substantially the same as the process of FIGS. 4A to 4C described above. That is, after sequentially forming a first insulating layer (not shown), the diffusion barrier layer 430, and a second insulating layer (not shown) on the sidewalls of the hole H, the first insulating layer close to the sidewalls of the hole H may be doped with the first dopant to form the selection element layer 420, and the second insulating layer far from the sidewalls of the hole H may be doped with the second dopant to form the variable resistance layer 440. In this case, the doping may be performed by a tilt ion implantation process. Next, the vertical electrode 450 may be formed by filling the hole H in which the selection element layer 420, the diffusion barrier layer 430, and the variable resistance layer 440 are formed with a conductive material.

Meanwhile, the memory device according to the embodiment shown in FIG. 8 includes the memory element 100 of FIG. 1 as the memory cell MC, but embodiments of the present disclosure are not limited thereto. The memory cell MC of the memory device of FIG. 8 may be formed to include the memory element described with reference to FIGS. 7A to 7C using the method for manufacturing the same, or the memory element described with reference to FIGS. 7A, 7B, 7D, and 7E using the method for manufacture the same.

According to the above-described embodiments, it may be possible to implement high integration and reduce process difficulty while securing characteristics of memory cells.

The above and other memory circuits or semiconductor devices based on the disclosed technology can be used in a range of devices or systems. FIGS. 9, 10, 11, and 12 provide some examples of devices or systems that can implement the memory circuits disclosed herein.

Figure 9:
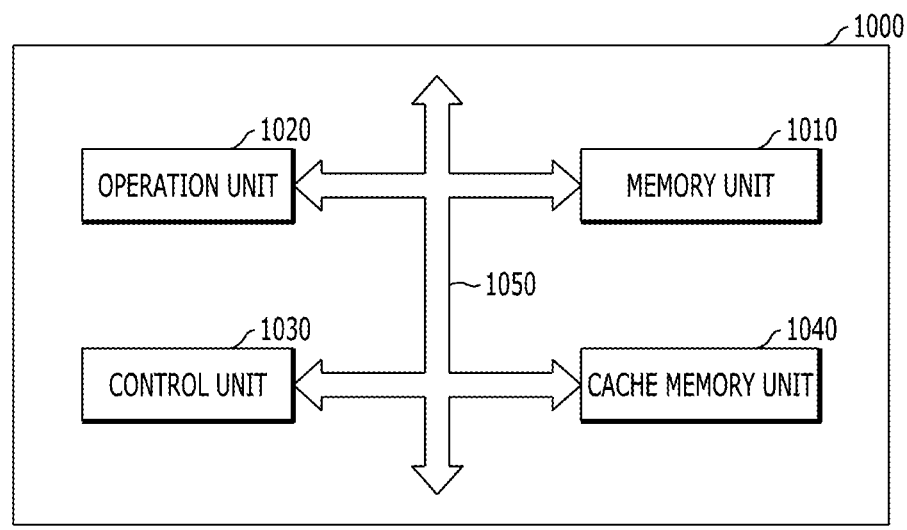
FIG. 9 is an example of configuration diagram of a microprocessor implementing memory circuitry based on the disclosed technology.

FIG. 9 is an example of configuration diagram of a microprocessor implementing memory circuitry based on the disclosed technology.

Referring to FIG. 9, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include various registers such as a data register, an address register, a floating point register and so on. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the embodiments. For example, the memory unit 1010 may include memory elements. Each of the memory element comprises: a selection element layer in which a first dopant is doped in an insulating material; and a variable resistance layer in which a second dopant is doped in the insulating material, wherein a diffusivity of the second dopant in the insulating material is greater than a diffusivity of the first dopant in the insulating material. Through this, in the memory unit 101, a reliability and fabricating processes may be improved. As a consequence, it is possible to improve operating characteristics of the microprocessor 1000.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present embodiment may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 10:
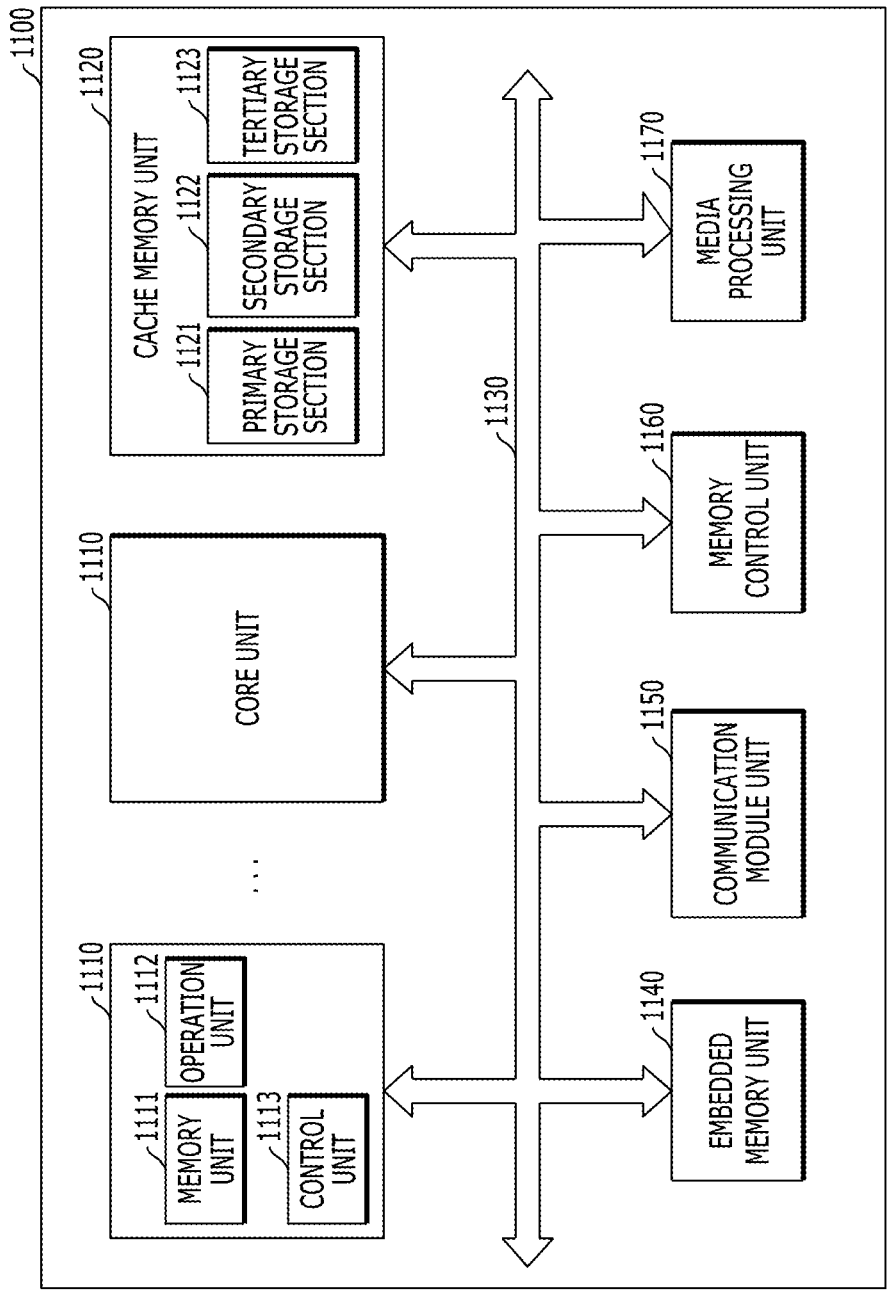
FIG. 10 is an example of configuration diagram of a processor implementing memory circuitry based on the disclosed technology.

FIG. 10 is an example of configuration diagram of a processor implementing memory circuitry based on the disclosed technology.

Referring to FIG. 10, a processor 1100 may improve performance and realize multi-functionality by including various functions other than those of the above-described microprocessor 1000. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present embodiment is a part which performs arithmetic logic operations for data inputted from an external device, and may include a memory unit 1111, an operation unit 1112 and a control unit 1113. The memory unit 1111, the operation unit 1112 and the control unit 1113 may be substantially the same as the memory unit 1010, the operation unit 1020 and the control unit 1030.

The cache memory unit 1120 is a part which temporarily stores data to compensate for a difference in data processing speed between the core unit 1110 operating at a high speed and an external device operating at a low speed. The cache memory unit 1120 may include a primary storage section 1121 and a secondary storage section 1122. Further, the cache memory unit 1120 may include a tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the embodiments. For example, the cache memory unit 1120 may include memory elements. Each of the memory elements comprises: a selection element layer in which a first dopant is doped in an insulating material; and a variable resistance layer in which a second dopant is doped in the insulating material, wherein a diffusivity of the second dopant in the insulating material is greater than a diffusivity of the first dopant in the insulating material. Through this, a reliability and fabricating processes may be improved in the cache memory unit 1120. As a consequence, it is possible to improve operating characteristics of the processor 1100.

Although it was shown in this embodiment that all the primary, secondary and tertiary storage sections 1121, 1122 and 1123 are configured inside the cache memory unit 1120, at least one of the primary, secondary and tertiary storage sections 1121, 1122 and 1123 of the cache memory unit 1120 may be configured outside the core unit 1110 and may compensate for a difference in data processing speed between the core unit 1110 and the external device.

The bus interface 1130 is a part which connects the core unit 1110, the cache memory unit 1120 and external device and allows data to be efficiently transmitted.

The processor 1100 according to the present embodiment may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. Storage sections in each of the core units 1110 may be configured to be shared with storage sections outside the core units 1110 through the bus interface 1130.

The processor 1100 according to the present embodiment may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 11:
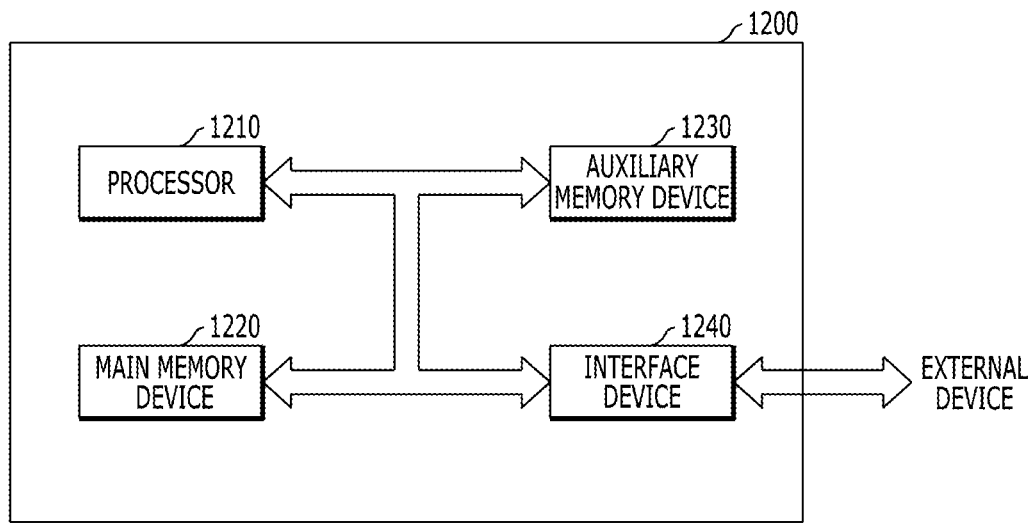
FIG. 11 is an example of configuration diagram of a system implementing memory circuitry based on the disclosed technology.

FIG. 11 is an example of configuration diagram of a system implementing memory circuitry based on the disclosed technology.

Referring to FIG. 11, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present embodiment may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may substantially the same as the above-described microprocessor 1000 or the above-described processor 1100.

The main memory device 1220 is a storage which can temporarily store, call and execute program codes or data from the auxiliary memory device 1230 when programs are executed and can conserve memorized contents even when power supply is cut off. The auxiliary memory device 1230 is a memory device for storing program codes or data. While the speed of the auxiliary memory device 1230 is slower than the main memory device 1220, the auxiliary memory device 1230 can store a larger amount of data. The main memory device 1220 or the auxiliary memory device 1230 may include one or more of the above-described semiconductor devices in accordance with the embodiments. For example, the main memory device 1220 or the auxiliary memory device 1230 may include memory elements. Each of the memory elements comprises: a selection element layer in which a first dopant is doped in an insulating material; and a variable resistance layer in which a second dopant is doped in the insulating material, wherein a diffusivity of the second dopant in the insulating material is greater than a diffusivity of the first dopant in the insulating material. Through this, a reliability and fabricating processes may be improved in the main memory device 1220 or the auxiliary memory device 1230. As a consequence, it is possible to improve operating characteristics of the system 1200.

Also, the main memory device 1220 or the auxiliary memory device 1230 may include a memory system (see the reference numeral 1300 of FIG. 12) in addition to the above-described semiconductor device or without including the above-described semiconductor device.

The interface device 1240 may be to perform exchange of commands and data between the system 1200 of the present embodiment and an external device. The interface device 1240 may be a keypad, a keyboard, a mouse, a speaker, a mike, a display, various human interface devices (HIDs), a communication device, and so on. The communication device may be substantially the same as the above-described communication module unit 1150.

Figure 12:
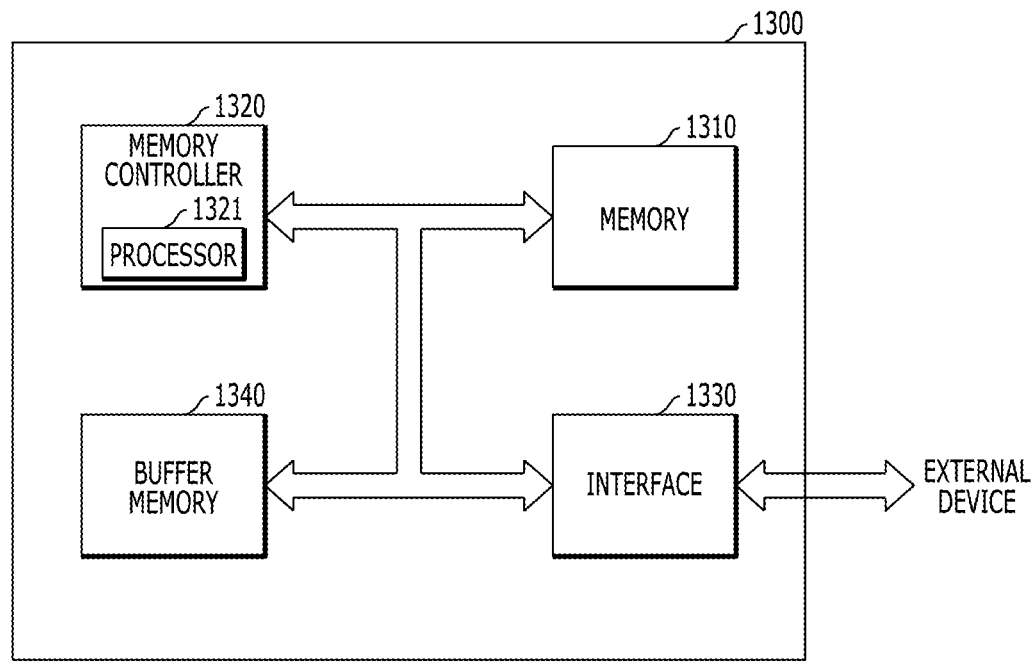
FIG. 12 is an example of configuration diagram of a memory system implementing memory circuitry based on the disclosed technology.

FIG. 12 is an example of configuration diagram of a memory system implementing memory circuitry based on the disclosed technology.

Referring to FIG. 12, a memory system 1300 may include a memory 1310 which has a nonvolatile characteristic as a component for storing data, a controller 1320 which controls the memory 1310, an interface 1330 for connection with an external device, and a buffer memory 1340 for storing data temporarily for efficiently transferring data between the interface 1330 and the memory 1310. The memory system 1300 may simply mean a memory for storing data, and may also mean a data storage device for conserving stored data in a long term. The memory system 1300 may be a disk type such as a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1310 or the buffer memory 1340 may include one or more of the above-described semiconductor devices in accordance with the embodiments. For example, the memory 1310 or the buffer memory 1340 may include memory elements. Each of the memory elements comprises: a selection element layer in which a first dopant is doped in an insulating material; and a variable resistance layer in which a second dopant is doped in the insulating material, wherein a diffusivity of the second dopant in the insulating material is greater than a diffusivity of the first dopant in the insulating material. Through this, in the memory 1310 or the buffer memory 1340, a reliability and fabricating processes may be improved. As a consequence, it is possible to improve operating characteristics of the memory system 1300.

The memory 1310 or the buffer memory 1340 may include various memories such as a nonvolatile memory or a volatile memory, in addition to the above-described semiconductor device or without including the above-described semiconductor device.

The controller 1320 may control exchange of data between the memory 1310 and the interface 1330. To this end, the controller 1320 may include a processor 1321 for performing an operation for, processing commands inputted through the interface 1330 from an outside of the memory system 1300 and so on.

The interface 1330 is to perform exchange of commands and data between the memory system 1300 and the external device. In the case where the memory system 1300 is a card type or a disk type, the interface 1330 may be compatible with interfaces which are used in devices having a card type or a disk type, or be compatible with interfaces which are used in devices similar to the above mentioned devices. The interface 1330 may be compatible with one or more interfaces having a different type from each other.

Features in the above examples of electronic devices or systems in FIGS. 9-12 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any disclosure or of what may be claimed, but rather as descriptions of features that may be specific to particular embodiments of particular disclosures. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few embodiments and examples are described. Other embodiments, enhancements and variations can be made based on what is described and illustrated in this patent document.

What is claimed is:

1. A method for fabricating an electronic device comprising a semiconductor memory including one or more memory elements, the method comprising:
    forming a first insulating layer;
    forming a diffusion barrier layer over the first insulating layer;
    forming a second insulating layer over the diffusion barrier layer, the second insulating layer and the first insulating layer being formed of a common insulating material;
    doping a first dopant into the first insulating layer to form a first element layer; and
    doping a second dopant into the second insulating layer to form a second element layer.

2. The method according to claim 1, wherein the first dopant generates a trap site in the insulating material, and
    wherein the second dopant is movable in the insulating material according to a voltage applied to the variable resistance layer.

3. The method according to claim 2, wherein a diffusivity of the second dopant in the insulating material is greater than a diffusivity of the first dopant in the insulating material.

4. The method according to claim 3, wherein the insulating material includes a silicon-containing insulating material,
    wherein the first dopant has a diffusion coefficient of less than $10^{-15}$ m$^2$/s in silicon at 1100° C., and
    wherein the second dopant has a diffusion coefficient of greater than $10^{-15}$ m$^2$/s in silicon at 1100° C.

5. The method according to claim 1, wherein the insulating material includes a silicon-containing insulating material or a metal-containing insulating material,
    wherein the first dopant includes gallium (Ga), boron (B), indium (In), phosphorus (P), arsenic (As), antimony (Sb), germanium (Ge), silicon (Si), carbon (C), tungsten (W), or a combination thereof, and
    wherein the second dopant includes copper (Cu), nickel (Ni), lithium (Li), iron (Fe), gold (Au), silver (Ag), or a combination thereof.

6. The method according to claim 1, wherein an ion implantation energy used in the doping of the first dopant is greater than an ion implantation energy used in the doping of the second dopant.

7. The method according to claim 1, wherein the doping of the first dopant, the doping of the second dopant, or both are performed by performing a plurality of ion implantation processes.

8. The method according to claim 7, wherein a plurality of projection range points associated with the plurality of ion implantation processes, respectively, are different from each other.

9. The method according to claim 1, wherein the diffusion barrier layer has a thickness sufficient to allow the first dopant doped into the first insulating layer to penetrate therethrough.

10. The method according to claim 9, wherein the diffusion barrier layer has a thickness in a range from 1 nm to 20 nm.

11. A method for fabricating an electronic device comprising a semiconductor memory including one or more memory elements, the method comprising:
    forming an insulating layer;
    doping a first dopant into a lower portion of the insulating layer to form a first element layer; and
    doping a second dopant into an upper portion of the insulating layer to form a second element layer.

12. The method according to claim 11, wherein the first dopant generates a trap site in the insulating layer, and
    wherein the second dopant is movable in the insulating layer according to a voltage applied to the variable resistance layer.

13. The method according to claim 12, wherein a diffusivity of the second dopant in the insulating layer is greater than a diffusivity of the first dopant in the insulating layer.

14. The method according to claim 13, wherein the insulating layer includes a silicon-containing insulating material,
    wherein the first dopant has a diffusion coefficient of less than $10^{-15}$ m$^2$/s in silicon at 1100° C., and
    wherein the second dopant has a diffusion coefficient of greater than $10^{-15}$ m$^2$/s in silicon at 1100° C.

15. The method according to claim 11, wherein the insulating layer includes a silicon-containing insulating material or a metal-containing insulating material,
    wherein the first dopant includes gallium (Ga), boron (B), indium (In), phosphorus (P), arsenic (As), antimony (Sb), germanium (Ge), silicon (Si), carbon (C), tungsten (W), or a combination thereof, and
    wherein the second dopant includes copper (Cu), nickel (Ni), lithium (Li), iron (Fe), gold (Au), silver (Ag), or a combination thereof.

16. The method according to claim 11, wherein an ion implantation energy used in the doping of the first dopant is greater than an ion implantation energy used in the doping of the second dopant.

17. The method according to claim 11, wherein the doping of the first dopant, the doping of the second dopant, or both are performed by performing a plurality of ion implantation processes.

18. The method according to claim 17, wherein a plurality of projection range points associated with the plurality of ion implantation processes, respectively, are different from each other.

19. The method according to claim 11, the method further comprising:

between the doping of the first dopant and the doping of the second dopant, doping a third dopant in an intermediate portion of the insulating layer to form a diffusion barrier layer, the third dopant being different from the first dopant and the second dopant.

20. The method according to claim 19, wherein the third dopant includes boron (B), carbon (C) or nitrogen (N).

* * * * *